United States Patent
Hooton et al.

(10) Patent No.: US 10,787,014 B2
(45) Date of Patent: Sep. 29, 2020

(54) THERMALLY CONDUCTIVE STRUCTURE FOR DISSIPATING HEAT IN A PORTABLE ELECTRONIC DEVICE

(71) Applicant: Apple Inc., Cupertino, CA (US)

(72) Inventors: Lee E. Hooton, Ridge, NY (US); Marwan Rammah, San Francisco, CA (US); James A. Bertin, San Jose, CA (US); Stoyan P. Hristov, San Jose, CA (US); William A. Counts, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/127,043

(22) Filed: Sep. 10, 2018

(65) Prior Publication Data

US 2019/0082555 A1 Mar. 14, 2019

Related U.S. Application Data

(60) Provisional application No. 62/557,090, filed on Sep. 11, 2017.

(51) Int. Cl.
*H05K 7/20* (2006.01)
*H05K 5/00* (2006.01)
(Continued)

(52) U.S. Cl.
CPC .............. *B41M 5/24* (2013.01); *F28F 21/084* (2013.01); *F28F 21/085* (2013.01);
(Continued)

(58) Field of Classification Search
CPC .. H05K 7/2039; H05K 5/0086; H05K 5/0217; F28F 21/084; F28F 21/085; H02J 50/10; H02J 7/025
See application file for complete search history.

(56) References Cited

U.S. PATENT DOCUMENTS 5,991,155 A * 11/1999 Kobayashi .......... H01L 23/3672
165/80.2
7,119,419 B2 10/2006 Kato et al.
(Continued)

FOREIGN PATENT DOCUMENTS

WO 2005048298 A2 5/2005

OTHER PUBLICATIONS

"Gorilla University: Quantum Induction Wireless Charging", Quantum Induction Technology—Gorilla Gadgets; https://gorillagadgets.com/blogs/gorilla-gadgets-blog/qi-quantum-induction-wireless-charging; Aug. 3, 2017, 9 pages.
(Continued)

*Primary Examiner* — Jayprakash N Gandhi
*Assistant Examiner* — Michael A Matey
(74) *Attorney, Agent, or Firm* — Dickinson Wright RLLP

(57) ABSTRACT

This application relates to a portable electronic device. The portable electronic device includes an operational component capable of generating heat and walls that define a cavity capable of carrying the operational component. The portable electronic device further includes a support plate that is welded to at least one of the walls. The support plate includes a thermally conductive layer that is thermally coupled to the operational component, where the thermally conductive layer includes a first material that is capable of conducting at least some of the heat away from the electronic component. The support plate further includes a first stiffness promoting layer that is welded to the thermally conductive layer, where the first stiffness promoting layer includes a second material having sufficient material hardness for welding the support plate to at least one of the walls such as to increase a stiffness of the support plate.

20 Claims, 14 Drawing Sheets

(51) Int. Cl.

| | | |
|---|---|---|
| *H05K 5/02* | (2006.01) | |
| *F28F 21/08* | (2006.01) | |
| *B41M 5/24* | (2006.01) | |
| *G06F 1/16* | (2006.01) | |
| *H04M 1/02* | (2006.01) | |
| *H01P 3/08* | (2006.01) | |
| *H05K 1/02* | (2006.01) | |
| *H05K 1/18* | (2006.01) | |
| *H05K 5/03* | (2006.01) | |
| *H05K 5/06* | (2006.01) | |
| *H05K 9/00* | (2006.01) | |
| *H01R 12/79* | (2011.01) | |
| *H05K 1/14* | (2006.01) | |
| *H02J 50/10* | (2016.01) | |
| *H02J 7/02* | (2016.01) | |

(52) U.S. Cl.
CPC .......... *G06F 1/1626* (2013.01); *G06F 1/1656* (2013.01); *H01P 3/08* (2013.01); *H04M 1/0202* (2013.01); *H05K 1/0216* (2013.01); *H05K 1/181* (2013.01); *H05K 5/0004* (2013.01); *H05K 5/0017* (2013.01); *H05K 5/0086* (2013.01); *H05K 5/0217* (2013.01); *H05K 5/03* (2013.01); *H05K 5/069* (2013.01); *H05K 7/2039* (2013.01); *H05K 9/0007* (2013.01); *H05K 9/0075* (2013.01); *H01R 12/79* (2013.01); *H02J 7/025* (2013.01); *H02J 50/10* (2016.02); *H04M 1/026* (2013.01); *H04M 1/0264* (2013.01); *H04M 1/0283* (2013.01); *H05K 1/147* (2013.01); *H05K 2201/10189* (2013.01)

(56) References Cited

U.S. PATENT DOCUMENTS

| | | | |
|---|---|---|---|
| 7,292,441 | B2 | 11/2007 | Smalc et al. |
| 7,583,834 | B2 | 9/2009 | McCollough et al. |
| 7,652,729 | B2 | 1/2010 | Minaguchi et al. |
| 7,760,289 | B2 | 7/2010 | Nakanishi et al. |
| 8,110,744 | B2 | 2/2012 | Wong et al. |
| 8,281,483 | B2 | 10/2012 | Hofmann et al. |
| 8,669,483 | B2 | 3/2014 | Shimura et al. |
| 8,740,634 | B2 | 6/2014 | Uesaka et al. |
| 8,762,749 | B2 | 6/2014 | Azancot et al. |
| 8,960,818 | B2 | 2/2015 | Myers et al. |
| 9,143,586 | B2 | 9/2015 | Allore et al. |
| 9,380,714 | B2 | 6/2016 | Shin et al. |
| 9,469,469 | B2 | 10/2016 | Rayner |
| 9,583,256 | B2 | 2/2017 | Lapetina et al. |
| 9,601,286 | B2 | 3/2017 | Lynch et al. |
| 9,973,013 | B2 | 5/2018 | Yan |
| 10,003,371 | B1 | 6/2018 | Given et al. |
| 10,218,830 | B1 | 2/2019 | Liu et al. |
| 2003/0066672 | A1* | 4/2003 | Watchko .................. C23C 4/00 174/50 |
| 2008/0151503 | A1* | 6/2008 | Aapro .................. H04M 1/026 361/714 |
| 2008/0164840 | A1 | 7/2008 | Kato et al. |
| 2010/0072952 | A1* | 3/2010 | Nakajima .............. H04B 1/036 320/150 |
| 2012/0234524 | A1 | 9/2012 | Fan et al. |
| 2013/0033581 | A1 | 2/2013 | Woo et al. |
| 2014/0118929 | A1 | 5/2014 | Leung et al. |
| 2014/0177197 | A1 | 6/2014 | Lampinen |
| 2014/0192467 | A1* | 7/2014 | Kwong ................. G06F 1/1601 361/679.3 |
| 2014/0367369 | A1 | 12/2014 | Nashner et al. |
| 2015/0111623 | A1 | 4/2015 | Hegemier et al. |
| 2015/0198864 | A1 | 7/2015 | Havskjold et al. |
| 2015/0241931 | A1 | 8/2015 | Carnevali et al. |
| 2015/0319881 | A1* | 11/2015 | Kusuda ............. H05K 7/20536 174/547 |
| 2017/0085764 | A1 | 3/2017 | Kim et al. |
| 2017/0300085 | A1 | 10/2017 | Hintermann |
| 2018/0053981 | A1 | 2/2018 | Bae et al. |
| 2018/0084680 | A1 | 3/2018 | Jarvis et al. |
| 2018/0190408 | A1 | 7/2018 | Chin |
| 2019/0041909 | A1 | 2/2019 | Pakula et al. |
| 2019/0082083 | A1 | 3/2019 | Jarvis et al. |

OTHER PUBLICATIONS

"Magnetic shielding materials to protect sensitive electronics", Electronic Products, https://www.electronicproducts.com/Packaging_and_Hardware/Shielding_and_Insulation/Magnetic_shielding_materials_to_protect_sensitive_electronics.aspx, posted on Sep. 22, 2014, 3 pages.

* cited by examiner

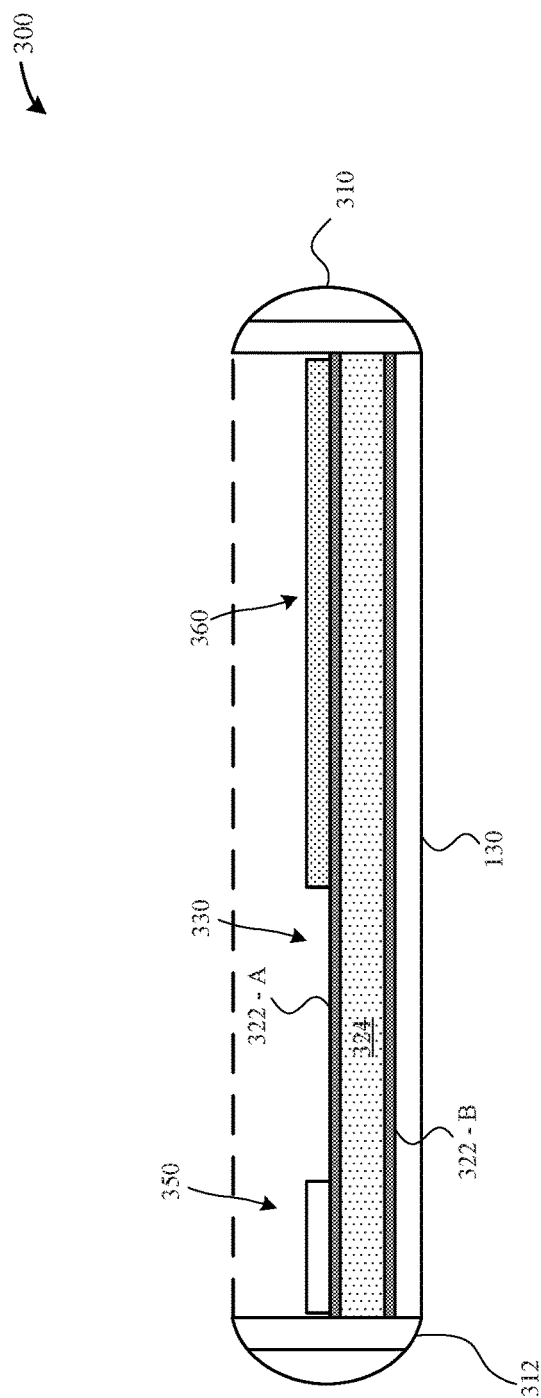
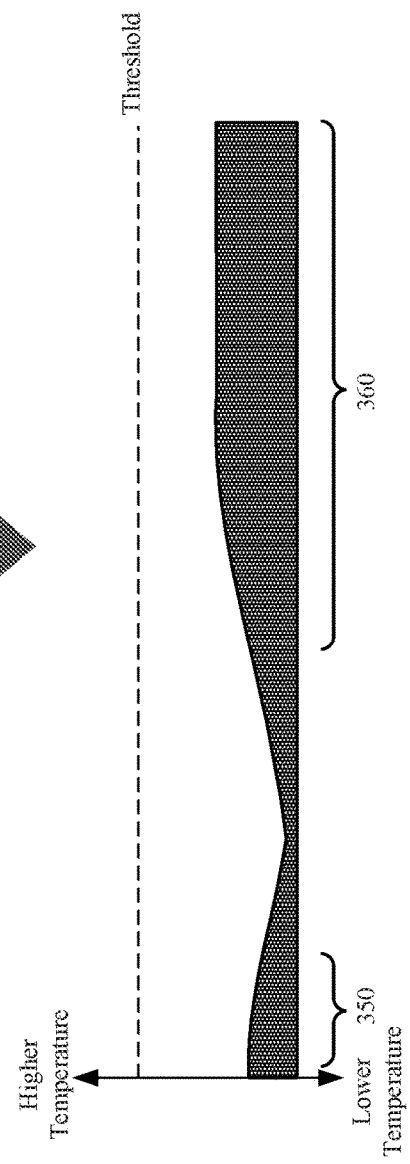
FIG. 3B
FIG. 3C

THERMALLY CONDUCTIVE STRUCTURE FOR DISSIPATING HEAT IN A PORTABLE ELECTRONIC DEVICE

CROSS-REFERENCE TO RELATED APPLICATIONS

The present application claims the benefit of U.S. Provisional Application No. 62/557,090, entitled "PORTABLE ELECTRONIC DEVICE," filed Sep. 11, 2017, which is incorporated by reference herein in its entirety for all purposes.

This patent application is also related and incorporates by reference in their entirety each of the following patent applications:
(i) U.S. Patent Provisional Application No. 62/681,499 entitled "CLADDED METAL STRUCTURES FOR DISSIPATION OF HEAT IN A PORTABLE ELECTRONIC DEVICE" by COUNTS et al. filed Jun. 6, 2018;
(ii) U.S. patent application Ser. No. 16/127,055 entitled "PLATE FOR MAGNETIC SHIELDING OF AN OPERATIONAL COMPONENT IN A PORTABLE ELECTRONIC DEVICE" by WAH et al. filed Sep. 10, 2018;
(iii) U.S. patent application Ser. No. 16/127,064 entitled "STRUCTURES FOR SECURING OPERATIONAL COMPONENTS IN A PORTABLE ELECTRONIC DEVICE" by RAMMAH et al. filed Sep. 10, 2018;
(iv) U.S. patent application Ser. No. 16/127,071 entitled "SPACE-EFFICIENT FLEX CABLE WITH IMPROVED SIGNAL INTEGRITY FOR A PORTABLE ELECTRONIC DEVICE" by SLOEY et al. filed Sep. 10, 2018; and
(v) U.S. patent application Ser. No. 16/126,984 entitled "SUBSTRATE MARKING FOR SEALING SURFACES" by HAWTHORNE et al. filed Sep. 10, 2018.

FIELD

The described embodiments relate generally to a support structure for carrying an operational component within a portable electronic device. More particularly, the described embodiments relate to the support structure including a thermally conductive core for dissipating thermal energy generated by the operational component.

BACKGROUND

Recent technological advances have enabled manufacturers to include a large number of operational components (e.g., processors, antennas, displays, cameras, haptic feedback components, etc.) in a small cavity of an enclosure of a portable electronic device. However, due to the small cavity and the heat generated by these operational components, the portable electronic device may experience a sustained elevated operating temperature. Consequently, the elevated operating temperature can lead to inefficient performance and premature failure of these operational components. Accordingly, there is a need for support structures that are capable of effectively dissipating the heat generated by these operational components.

SUMMARY

This paper describes various embodiments that relate to a support structure for carrying an operational component within a portable electronic device. In particular, the various embodiments relate to the support structure including a thermally conductive core for dissipating thermal energy generated by the operational component.

According to some embodiments, a portable electronic device is described. The portable electronic device includes an operational component that generates heat, a housing having walls that define a cavity capable of carrying the operational component within the cavity, and a support plate that is joined to one of the walls. The support plate includes a thermally conductive layer that carries and is in thermal contact with the operational component, where the thermally conductive layer includes a first material that is capable of conducting at least some of the heat away from the operational component, and a layer that stiffens the support plate, the layer including a second material.

According to some embodiments, an enclosure for a portable electronic device is described. The enclosure includes walls that define a cavity, where the walls are capable of carrying an operational component that generates thermal energy within the cavity. The enclosure includes a support plate that (i) is thermally coupled to and joined to one of the walls, and (ii) supports the operational component. The support plate further includes a thermally conductive core that is in thermal contact with the operational component, where the thermally conductive core defines a directional path by which the thermal energy is conducted away from the operational component, and a thermal insulation layer that is in thermal contact with the thermally conductive core, where the thermal insulation layer is capable of conducting the thermal energy away from the wall joined to the support plate.

According to some embodiments, an enclosure for a portable electronic device, is described. The enclosure includes an operational component that generates heat, walls that define a cavity, the walls capable of carrying the operational component within the cavity, and a support plate that carries the operational component. The support plate includes a thermally conductive core formed of a first material having a first coefficient of thermal expansion, where the thermally conductive core is capable of conducting the heat away from the operational component, a first metal layer that overlays the thermally conductive core, and a second metal layer that is overlaid by the thermally conductive core, where the first and second metal layers include a second material having a second coefficient of thermal expansion that is less than the first coefficient of thermal expansion.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

FIGS. 3A-3C illustrate various views of a portable electronic device that includes a support structure for dissipating thermal energy generated by an operational component, in accordance with some embodiments.

DETAILED DESCRIPTION

Figure 1A:
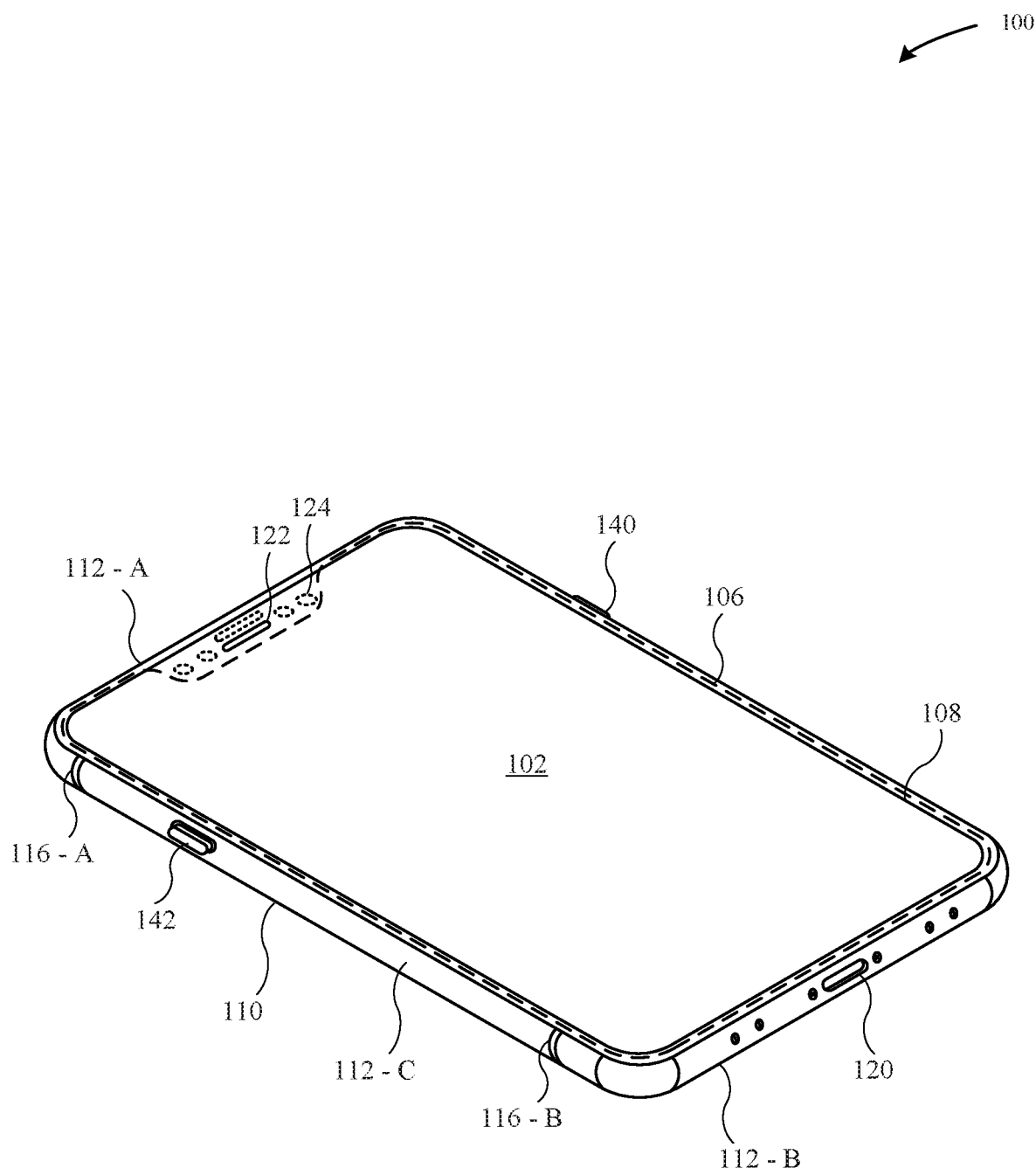
FIGS. 1A-1B illustrate perspective views of a portable electronic device that includes a support structure for dissipating thermal energy generated by an operational component, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein relate generally to a support structure for a portable electronic device. In particular, the support structure includes a thermally conductive core for dissipating thermal energy generated by the operational component. As described herein, the term dissipation can refer to the transformation of mechanical energy into energy dissipation. The term thermal dissipation can also be referred to as thermal conduction.

Although recent technological advances have enabled portable electronic device manufacturers to fit a large combination of different operational components (e.g., processor, antenna, camera, sensor, etc.) within a single enclosure of a portable electronic device, the portable electronic device is consequently subject to operating at a sustained elevated operating temperature. As a result, these operational components may experience premature failure. Additionally, the sustained elevated operating temperature may be perceived by a user as heat as absorbed by walls of the enclosure where the user's fingers are placed to support the enclosure.

To cure the aforementioned deficiencies, the systems and techniques described herein relate to support structures for carrying these operational components. In particular, the support structures include a thermally conductive layer that is capable of conducting thermal energy away from these operational components. Furthermore, the support structures may include at least one stiffness promoting layer. The stiffness promoting layer may increase the rigidity of the support structure as well as enable the support structure to be welded to the enclosure, thereby preventing the operational components from becoming permanently misaligned such as when the portable electronic device is exposed to a load associated with a drop event (e.g., dropping the portable electronic device on a hard surface). In some examples, the stiffening promoting layer may also be referred to as a stiffening layer.

According to some embodiments, a portable electronic device is described. The portable electronic device includes an operational component capable of generating heat, a housing having walls that define a cavity capable of carrying the operational component, and a support plate that is joined to one of the walls. The support plate includes a thermally conductive layer that carries and is in thermal contact with the operational component, where the thermally conductive layer includes a first material that is capable of conducting at least some of the heat away from the operational component, and a stiffener that promotes stiffness of the support plate, where the stiffener includes a second material having a material hardness suitable for welding the support plate to the wall.

These and other embodiments are discussed below with reference to FIGS. 1A-1B, 2, 3A-3C, 4-6, 7A-7F, 8A-8B, and 9-11. However, those skilled in the art will readily appreciate that the detailed description given herein with respect to these figures is for explanatory purposes only and should not be construed as limiting.

Figure 1B:
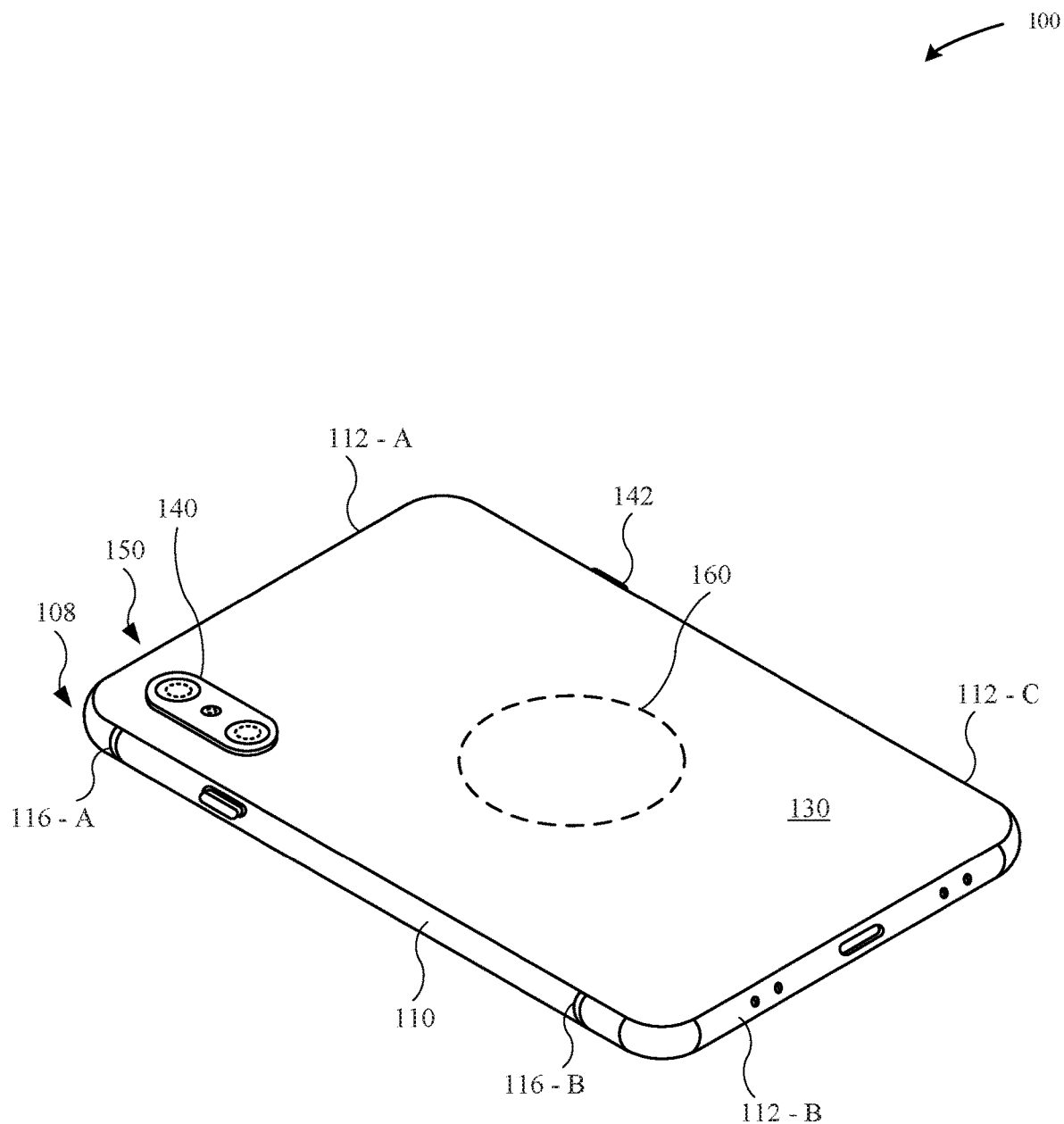

FIGS. 1A-1B illustrate a portable electronic device that includes support structures, in accordance with various embodiments. In particular, the support structures are capable of supporting operational components that are carried within a cavity of an enclosure of the portable electronic device. According to some examples, the portable electronic device can include a computing device, a smartphone, a laptop, a smartwatch, a fitness tracker, a mobile phone, a wearable consumer device, and the like. The enclosure of the portable electronic device can also be referred to as a housing.

FIG. 1A illustrates a first perspective view of the portable electronic device 100, where the portable electronic device 100 includes an enclosure 110 having walls that define a cavity (not illustrated), where one or more operational components are carried within the cavity. The enclosure 110 includes a top wall 112-A, a bottom wall 112-B, and side walls 112-C.

FIG. 1A illustrates that the portable electronic device 100 includes a display assembly 102 that covers a majority of a top surface of the enclosure 110. The display assembly 102 can include a capacitive unit and/or a force detection unit that is capable of detecting an input at the display assembly 102 and presenting a corresponding graphical output at the display assembly 102. In some embodiments, the display assembly 102 is overlaid by a protective cover 108, where the protective cover 108 is secured with a trim structure 106. In particular, the trim structure 106 may be joined to the enclosure 110 with an attachment feature, such as an adhesive, a weld, and the like. The protective cover 108 may prevent surface abrasions and scratches from damaging the display assembly 102. The protective cover 108 may be formed from a transparent material, such as glass, plastic, sapphire, or the like.

In some embodiments, the top wall 112-A may be separated from the bottom wall 112-B by a dielectric material 116-A, B, and the side walls 112-C may be separated from the top wall 112-A and the bottom wall 112-B by the dielectric material 116-A, B. The dielectric material 116-A, B can include plastic, injection-molded plastic, polyethylene terephthalate ("PET"), polyether ether ketone ("PEEK"), ceramic, and the like. By incorporating the dielectric material 116-A, B, the walls 112-A, B, C are capable of being electrically isolated from each other.

According to some embodiments, the portable electronic device 100 includes a button 140 and a switch 142 that are carried along the side wall 112-C. The bottom wall 112-B includes a connector 120 that is capable of providing data and/or power to the portable electronic device 100. In some examples, the connector 120 refers to a bus and power connector.

According to some embodiments, the portable electronic device 100 includes a notch 122 in proximity to the top wall 112-A. As illustrated in FIG. 1A, the notch 122 is defined by a cut-out of the protective cover 108. The notch 122 includes one or more electronic components 124 (e.g., infrared detector, front-facing camera, etc.). In some examples, the one or more electronic components 124 may be utilized for facial recognition. It should be noted that the supporting structures described herein may be utilized to secure these electronic components 124 such as to prevent these electronic components 124 from becoming dislodged or misaligned when the portable electronic device 100 experiences a load event.

According to some examples, at least one of the top wall 112-A, the bottom wall 112-B, or the side wall 112-C may be formed of material other than metal. Beneficially, the use of non-metal material can reduce the amount of electromagnetic interference associated with the enclosure 110 and a wireless transceiver that is carried within the enclosure 110. Additionally, the use of non-metal material reduces the amount of parasitic capacitance between any metal support structures that are carried within the cavity and the enclosure 110. According to some examples, the non-metal material includes glass, plastic, ceramic, and the like. Although non-metal material such as glass is beneficial in permitting electromagnetic waves to pass through the enclosure 110, the glass is also more susceptible than metal to cracking or deforming when the portable electronic device 100 experiences a drop event.

According to some embodiments, the portable electronic device 100 carries one or more operational components within a cavity (not illustrated) of the portable electronic device 100. These operational components may include a circuit board, an antenna, a multi-core processor, a haptic feedback module, a camera, a sensor, an IR detector, an inductive charging coil, and the like. It should be noted that the operational component can generate a large amount of thermal energy, e.g., between about 60 W-100 W of thermal energy. Indeed, circuits and processors are capable of generating a large amount of thermal energy due to constant switching of transistors. Because the operational component can generate a large amount of thermal energy (e.g., heat, etc.), the enclosure 110, such as the side walls 112-C can absorb a significant amount of the thermal energy which can render a feeling of discomfort when a user handles the portable electronic device 100. Furthermore, generating a large amount of thermal energy may lead to increasing operating temperature within the portable electronic device 100; thus, leading to decreased operating performance and potential premature failure of components.

Additionally, the amount of the thermal energy that is absorbed by the enclosure 110 is further exacerbated by the materials of the enclosure 110. In particular, the materials of the enclosure 110 may have a low rate of thermal conductivity. For example, the enclosure 110 can include one or more types of materials such as metal, polymers, glass, ceramic, and the like. In some examples, the metal can include at least one of a steel alloy, aluminum, aluminum alloy, titanium, zirconium, magnesium, copper, and the like. In some examples, the enclosure 110 can include a metal oxide layer that is formed from a metal substrate.

FIG. 1B illustrates a second perspective view of the portable electronic device 100, in accordance with some embodiments. As illustrated in FIG. 1B, an operational component 150 is carried at least in part within a protruding trim structure 140. The protruding trim structure 140 is disposed in proximity to a corner 108 of the enclosure 110. In some examples, proximity may refer to the operational component 150 is a distance of less than about 50 mm from the corner 108. As illustrated in FIG. 1B, the operational component 150 is a camera system having dual lenses (e.g., wide and a telephoto, etc.). Additionally, the camera system may include a flash module.

As illustrated in FIG. 1B, the protruding trim structure 140 is secured to and extends from a back wall 130 of the portable electronic device 100. According to some examples, the back wall 130 is formed of a material other than metal. The non-metal material enables a magnetic field to pass through the enclosure 110 in order to charge wireless charging coils 160, such as magnetic cores that include ferrites.

Figure 2:
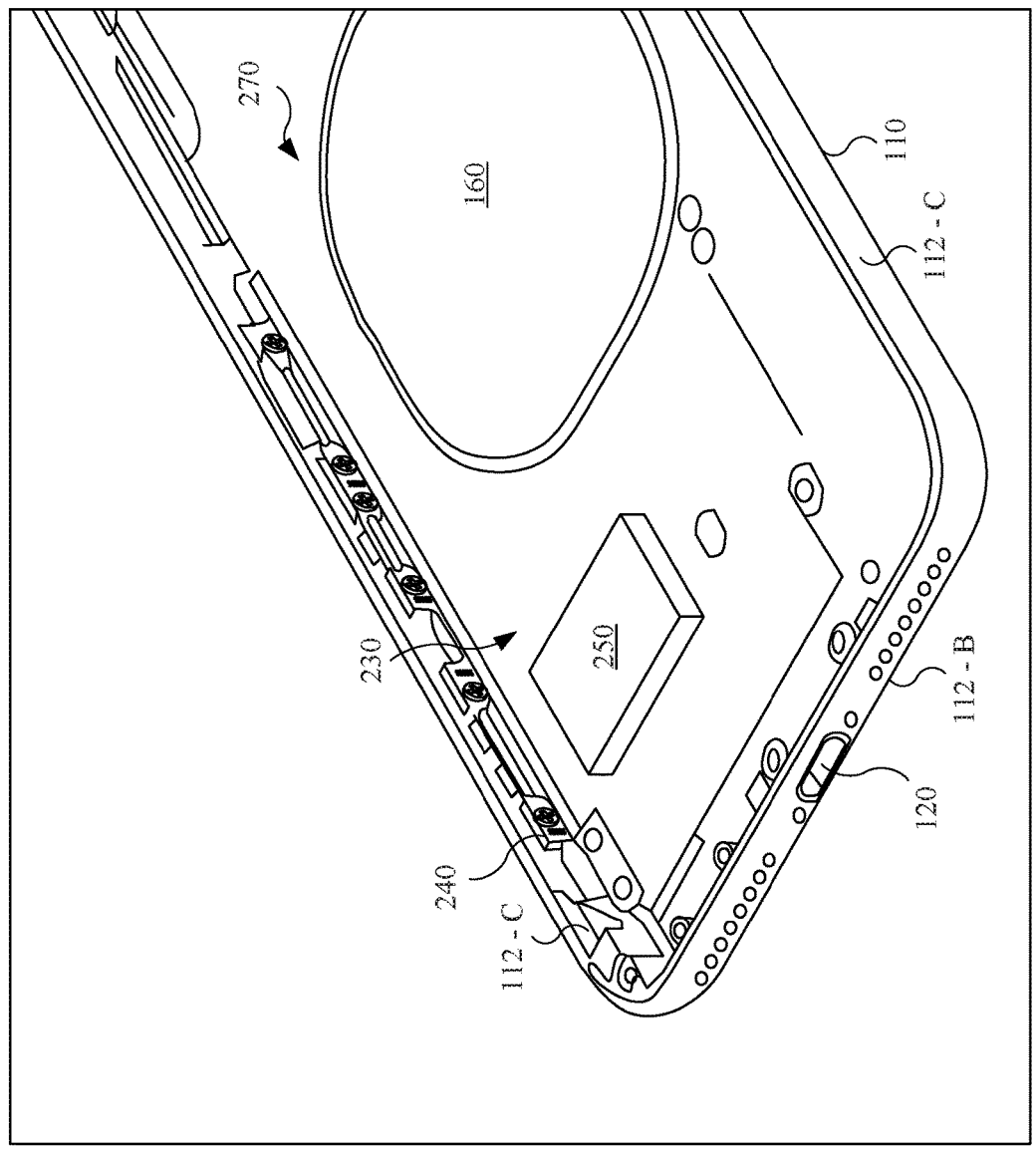
FIG. 2 illustrates a perspective view of a portable electronic device that includes a support structure for dissipating thermal energy generated by an operational component, in accordance with some embodiments.

FIG. 2 illustrates a magnified perspective view of internal components of a portable electronic device 200, in accordance with some embodiments. In particular, FIG. 2 illustrates the portable electronic device 200 without a display assembly 102 and a protective cover 108, thereby revealing a support plate 230. According to some examples, the support plate 230 is capable of carrying at least one operational component 250 within a cavity 270 of the portable electronic device 200. In some examples, the operational component 250 is capable of generating an amount of heat while the operational component 250 is performing a function. According to some embodiments, multiple operational components 250 may be carried along a top surface of the support plate 230. In some examples, the operational component 250 can include a circuit board, a power supply unit (e.g., a battery, etc.), a camera system, a haptic feedback module, a sensor, an inductive charging coil, and the like.

As illustrated in FIG. 2, the support plate 230 is secured to the enclosure 110 of the portable electronic device 200. In particular, at least one of the top wall 112-A, the bottom wall 112-B, or the side wall 112-C is joined to the support plate 230. According to some examples, the support plate 230 is joined to the enclosure 110 by a rail feature 240. In particular, the rail feature 240 includes a first surface that is joined to a surface of the enclosure 110 and a second surface that is joined to the support plate 230. In some examples, the first surface is generally orthogonal to the second surface. In other examples, the first surface is other than parallel to the second surface. According to some examples, the rail feature 240 is further joined to the support plate 230 and the enclosure 110 by at least one of a weld, a cladded structure, an adhesive, and the like. Beneficially, joining the support plate 230 to the enclosure 110 may increase the rigidity or stiffness of lateral ends of the support plate 230. This may be beneficial in preventing the operational component that is carried by the support plate 230 from shifting and becoming misaligned when the enclosure 110 of the portable electronic device 200 is subject to a load as a result of a drop event.

As illustrated in FIG. 2, the operational component 250 is carried along a top surface of the support plate 230. It should be noted that the support plate 230 does not intersect and/or overlap an inductive charging coil 160. This is particularly beneficial if the support plate 230 includes a metal material which may adversely impact the ability of a magnetic field to pass through the enclosure 110 to reach the inductive charging coil 160. Additionally, because the inductive charging coil 160 may generate an amount of heat during a charging operation, it may be preferable to not position the operational component 250 immediately adjacent to the inductive charging coil 160.

Figure 3A:
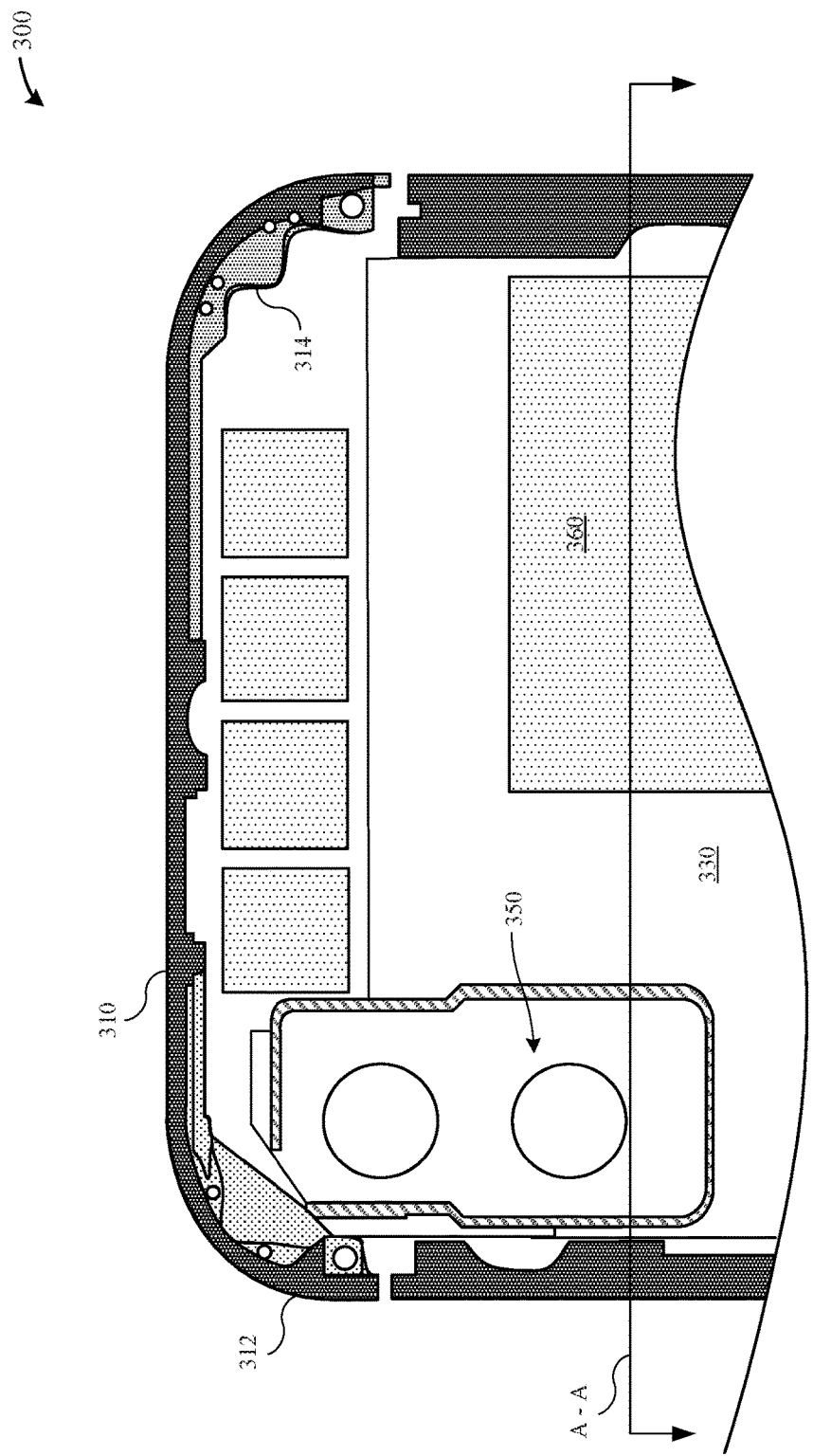

FIG. 3A illustrates a partial overhead view of internal components of a portable electronic device 300, in accordance with some embodiments. In particular, FIG. 3A illustrates the portable electronic device 300 without a display assembly 102 and a protective cover 108, thereby revealing a support plate 330 that is carried within a cavity of the enclosure 310. According to some examples, the enclosure 310 may be formed of metal, such as stainless steel, aluminum, titanium, and the like such that the enclosure 310 functions as an active antenna. In some examples, the enclosure 310 includes different metal sections, such as a long arm section 312 and a short arm section 314 that are capable of transmitting and/or receiving high-frequency electromagnetic waves.

As illustrated in FIG. 3A, the support plate 330 carries a camera system 350 and a power supply unit 360. According to some examples, the power supply unit 360 and the camera system 350 may be separated from each other by a sufficient distance so as to minimize an amount of heat in any one region of the cavity. According to some examples, the portable electronic device 300 includes thermistors for detecting an operating temperature within the operating environment of the portable electronic device 300. In response to determining that the current operating temperature exceeds a temperature threshold in any one region, a processor (not illustrated) may adjust the operating parameters (e.g., processing speed, increase cooling, etc.) of the portable electronic device 300 so as to prevent the current operating temperature from reaching an upper operating temperature limit.

FIG. 3B illustrates a cross-sectional view of the portable electronic device 300 as taken along the A-A reference line of the portable electronic device 300 of FIG. 3A, in accordance with some embodiments. As will be described in greater detail herein, the support plate 330 includes a thermally conductive core 324 so as to facilitate in limiting the current operating temperature of the portable electronic device 300 in any one region of the cavity. According to some examples, the thermally conductive core 324 is capable of dissipating thermal energy (e.g., heat) that is generated by the operational component(s)—e.g., the camera system 350 and the power supply unit 360—away from these operational component(s). Beneficially, the thermally conductive core 324 spreads heat away from a single region, thereby preventing a "hot spot" from being created. Additionally, the thermally conductive core 324 is capable of more uniformly spreading the heat throughout the cavity of the portable electronic device 300 so as to limit the current operating temperature within the cavity and enable the operating components(s) to be run longer and more efficiently.

As illustrated in FIG. 3B, the support plate 330 is joined to metal bands 312 of the portable electronic device 300, where the metal bands 312 may correspond to a perimeter structure of the portable electronic device 300. Specifically, FIG. 3B illustrates an upper stiffening layer 322-A that overlays the thermally conductive core 324 and a lower stiffening layer 322-B that is overlaid by the thermally conductive core 324. According to some examples, the operational component(s) are secured to the upper stiffening layer 322-A by at least one attachment feature (not illustrated) such as a weld, an adhesive, a fastener, and the like. Additionally, the support plate 330 may be joined to the metal bands 312 by an attachment feature such as a rail feature—e.g., the rail feature 240, a weld, an adhesive, a fastener, an interlock feature, and the like.

According to some examples, the support plate 330 may include at least one of the upper stiffening layer 322-A or the lower stiffening layer 322-B. Additionally, the upper and lower stiffening layers 322-A, B may be formed of different materials and may have different thicknesses in order to impart different stiffness properties. These aspects will be described in greater detail with reference to FIGS. 6A-6F.

Notably, the upper and lower stiffening layers 322-A, B provide an amount of stiffness for the support plate 330 not otherwise possible where the support plate 330 only includes the thermally conductive core 324. In particular, stiffness of the support plate 330 is important because the support plate 330 is generally overlaid by the back wall 130 of the portable electronic device 100 and an adhesive. Because the enclosure 110 may not be a unibody structure due to the back wall 130 being formed of a different material than the walls of the enclosure 110, there is a reduction in overall stiffness relative to a unibody metal enclosure.

FIG. 3C illustrates an exemplary diagram of a cross-sectional heat map that corresponds to the cross-sectional view of the portable electronic device 300 of FIG. 3B, in accordance with some embodiments. As illustrated in FIG. 3C, the heat generated by the operational component(s)—e.g., the camera system 350 and the power supply unit 360—is more uniformly spread throughout the cavity of the portable electronic device 300. Additionally, the support plate 330 is capable of limiting the current operating temperature of the portable electronic device 300 so that it falls below a predetermined temperature threshold.

According to some embodiments, a shape/dimension of the thermally conductive core 324 may define a directional path by which the thermal energy is conducted away from the operational components—e.g., the camera system 350 and the power supply unit 360. For example, if a thickness of the thermally conductive core 324 is greatest along the peripheral edges of the thermally conductive core 324 and thinnest along the medial line of the thermally conductive core 324, then the thermally conductive core 324 may generate a thermal heat dissipation path that resembles an inverted bell curve. Additionally, shapes/dimensions of the upper and lower stiffening layers 322—A, B may also contribute to the directional path by which the thermal energy is conducted away from the operational components.

Figure 4:
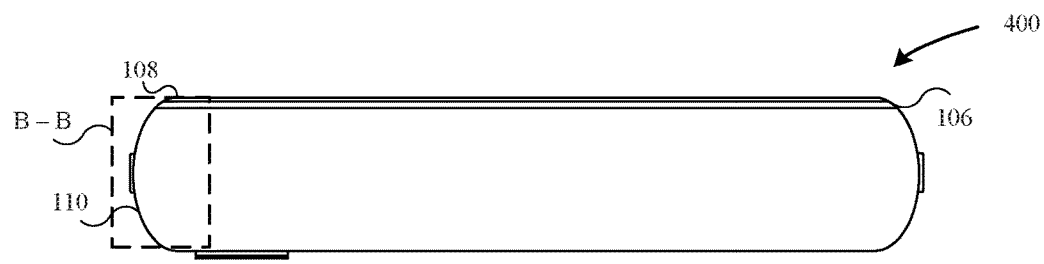
FIG. 4 illustrates a side view of a portable electronic device that includes a support structure for dissipating thermal energy generated by an operational component, in accordance with some embodiments.

FIG. 4 illustrates a side view of a portable electronic device 400, in accordance with some embodiments. As illustrated in FIG. 4, the portable electronic device 400 includes an enclosure 110 that carries operational components within a cavity. The enclosure includes a protective cover 108 that is secured to a trim structure 106 that overlays an upper surface of the enclosure 110.

Figure 5:
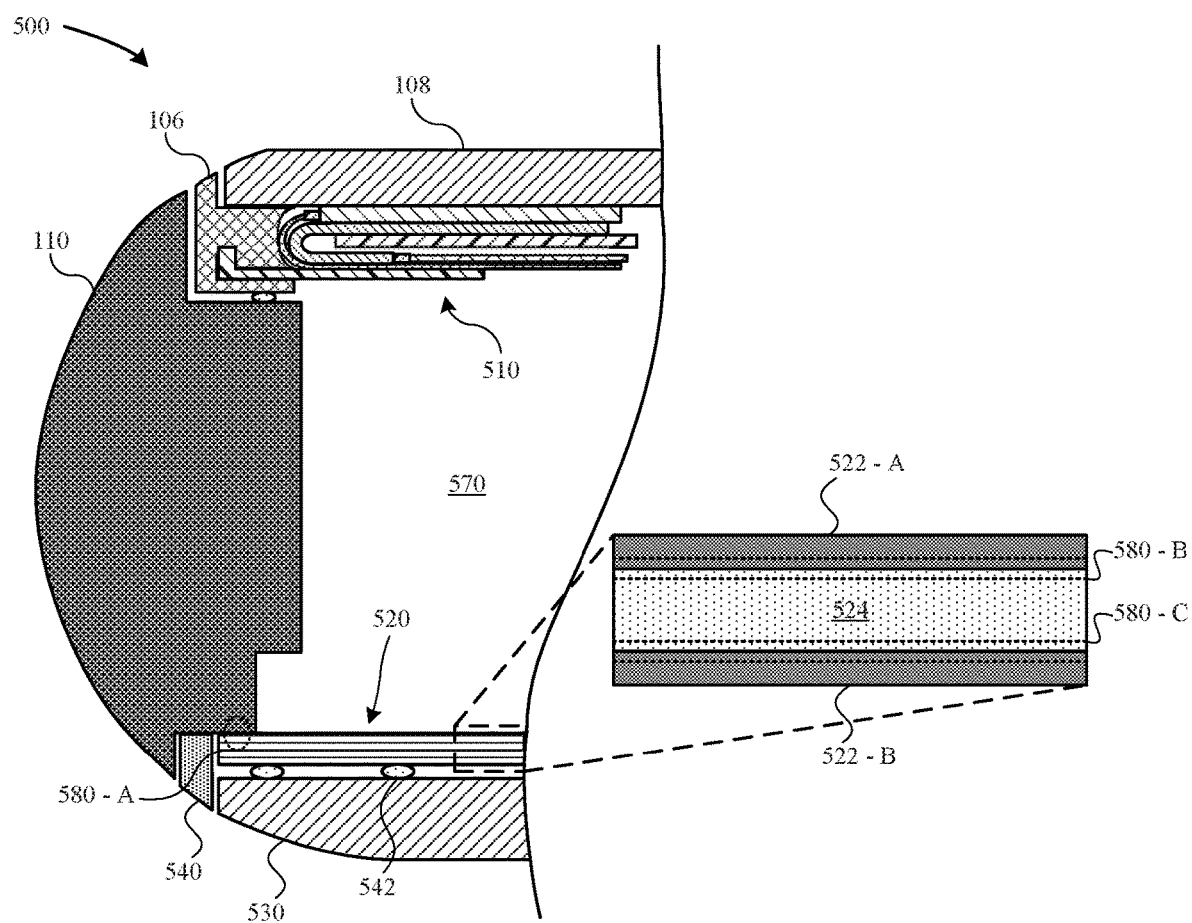
FIG. 5 illustrates a cross-sectional view of a portable electronic device that includes a support structure for dissipating thermal energy generated by an operational component, in accordance with some embodiments.

FIG. 5 illustrates a cross-sectional view of a portable electronic device 500 as taken along the reference section B-B of the portable electronic device 400, in accordance with some embodiments. FIG. 5 illustrates that the portable electronic device 500 includes an enclosure 110 that corresponds to the side walls 112-C of the portable electronic device 100. The upper surface of the enclosure 110 supports a display assembly 510 that is secured by a trim structure 106. Additionally, a protective cover 108 overlays the display assembly 510. The enclosure 110 is joined to a perimeter structure 540. Additionally, the enclosure is joined to a support plate 520, where the support plate 520 overlays a back wall 530 of the portable electronic device 500. In some examples, the support plate 520 is joined to the back wall 530 by an attachment feature 542 such as an adhesive. Although not illustrated in FIG. 5, the support plate 520 carries at least one operational component.

As illustrated in FIG. 5, the support plate 520 includes an upper stiffening layer 522-A and a lower stiffening layer 522-B that are separated by a thermally conductive core 524. According to some embodiments, the support plate 520 is welded to the enclosure 110 and/or the perimeter structure 540. In some examples, the upper stiffening layer 522-A includes a cladded material, such as cladded stainless steel that provides sufficient stiffness for the portable electronic device 500 to hold the support plate 520. Additionally, the lower stiffening layer 522-B may include cladded stainless steel. In some examples, the upper and lower stiffening layers 522-A, B are formed of stiffness-inducing materials such as stainless steel, titanium, molybdenum, and the like. Additionally, the upper and lower stiffening layers 522-A, B may impart greater abrasion resistance and hardness to the support plate 520, thereby also shielding the thermally conductive core 524 from abrasion. It should be noted that the material of the upper and lower stiffening layers 522-A, B should be of sufficient hardness so that the support plate 520 can be joined to the enclosure 110 and/or the perimeter structure 540. In some examples, the upper and lower stiffening layers 522-A, B include at least one of copper (117 GPa), stainless steel (193 GPa), or cladded stainless steel (184 GPa) so as to impart the necessary amount of stiffness to weld the upper and lower stiffening layers 522-A, B to the thermally conductive core 524.

As illustrated in FIG. 5, the support plate 520 is cladded to the enclosure 110 at heat affected zones 580-A. Additionally, the upper and lower stiffening layers 522-A, B are cladded to the thermally conductive core 524 at heat affected zones 580-B, C, respectively. The heat affected zones 580-A, B, C can represent where cladding material (e.g., stainless steel, etc.) and the metal substrate (e.g., copper, copper alloy, aluminum alloy, etc.) melt and mix together to form a metallurgical bond. In some examples, the heat affected zones 580-A, B, C are characterized as having a high degree of mixing between the cladding material and the metal substrate. In some examples, the cladding is performed by a laser cladding process.

In some examples, the thermally conductive core 524 is formed of a material having a high coefficient of thermal conductivity such as copper, aluminum, graphite, and the like. Although in some examples, it may be preferable to not use graphite because graphite is a frangible material that may be difficult to utilize as a structural element for supporting operational component(s).

Figure 6:
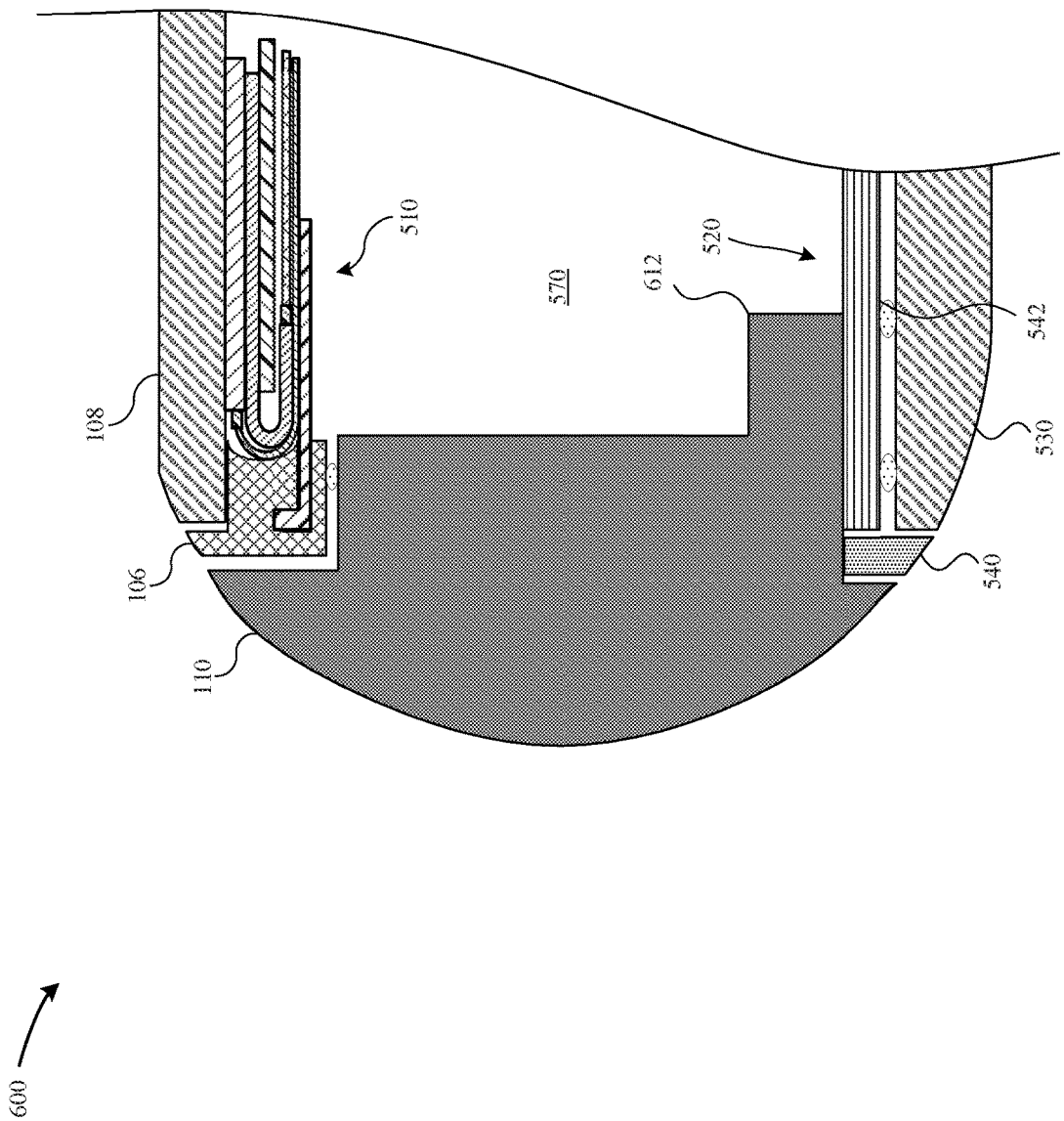
FIG. 6 illustrates a cross-sectional view of a portable electronic device that includes a support structure for dissipating thermal energy generated by an operational component, in accordance with some embodiments.

According to some examples, the upper and stiffening layers 522-A, B may have different thicknesses. Although it may be preferable to have symmetry in the thicknesses between the upper and lower stiffening layers 522-A, B so as to prevent and/or minimize deformation of the thermally conductive core 524, especially when the operating temperature of the thermally conductive core 524 is increased while conducting heat away from operational component(s). For instance, the coefficient of thermal conductivity of the material of the thermally conductive core 524 may be counteracted by the coefficient of thermal conductivity of the material of the upper and lower stiffening layers 522-A, B. By implementing a tri-layer as illustrated in FIG. 6, the upper and lower stiffening layers 522-A, B may serve to generally maintain the shape of the thermally conductive core 524. In contrast, if the support plate 520 includes a single stiffening layer and the thermally conductive core 524, then the thermally conductive core 524 may be more susceptible to deforming in shape.

According to some examples, the upper and lower stiffening layers 522-A, B are characterized as having a thermal rate of conductivity that is less than the thermally conductive core 524. Accordingly, the upper and lower stiffening layers 522-A, B can function as a thermal barrier that prevents the thermal energy from being absorbed by the side walls 112-C of the enclosure 110 while the thermally conductive core 524 functions as a thermal bridge. In particular, the thermal bridge creates a thermal path of least resistance for heat transfer from the operational component(s).

Furthermore, the lower stiffening layer 522-B may function as a thermal insulation to prevent the thermal energy (e.g., heat) from spreading to the back wall 530. Indeed, the lower stiffening layer 522-B may trap most of the heat within the thermally conductive core 524, thereby causing the heat to instead be spread by the thermally conductive core 524 laterally through the cavity 570 of the portable electronic device 500 (e.g., between the side walls 112-C, between the top wall 112-A and the bottom wall 112-B, etc.) instead of vertically through the cavity 570 (i.e., top-down between the back wall 130 and the protective cover 108). Beneficially, by preventing the heat from spreading to the back wall 530, the portable electronic device 500 prevents heat from prematurely wearing out the adhesive 542 as well as preventing a "hot spot" along the back wall where a user's hand may likely be in contact with the portable electronic device 500.

Additionally, the upper and stiffening layers 522-A, B may have a different thickness than the thermally conductive core 524. According to some examples, the ratio between the upper stiffening layer 522-A, the thermally conductive core 524, and the lower stiffening layer 522-B is about 1:2:1 (25%-50%-25%). It should be noted that these ratios are largely dependent upon the particular process for welding cladded stainless steel to the thermally conductive core 524. Additionally, these ratios may be balanced in order to achieve an ideal combination of stiffness and thermal conductivity.

In some examples, the upper and lower stiffening layers 522-A, B have an upper limit of thickness of about 60-70 microns. In some examples, the thermally conductive core 524 has a lower limit of thickness of about 35-50 microns. It should be noted that if the thermally conductive core 524 is less than about 35 microns thick, then the thermally conductive core 524 becomes less effective at dissipating heat from the operational component(s). In some examples, the thickness of the support plate 520 is between about 100 microns to about 500 microns.

Although FIG. 5 illustrates that the upper and stiffening layers 522-A, B separate the thermally conductive core 524, it should be noted that the support plate 520 may also include the thermally conductive core 524 that corresponds to an exterior surface of the support plate 520. In this particular embodiment, the thermally conductive core 524 may overlay a single stiffening layer.

Additionally, the support plate 520 may be used as a ground for the chassis for the portable electronic device 500. In some examples, the support plate 520 is grounded together with the perimeter structure 540, such as if the perimeter structure 540 is formed of metal.

According to some examples, the support plate 520 includes features to limit the amount of thermal energy that is conducted away from the operational component(s). For instance, the features may include parts, gaps or slots in the support plate (520) that are positioned in selective regions to minimize the amount of heat that is conducted away. Specifically, because the support plate 520 may be welded to the enclosure 110 and/or the perimeter structure 540, the support plate 520 includes these features to minimize and/or prevent heat from conducting to the walls—e.g., the side walls 112-C and prevent "hot spots" from generating along the surfaces of the enclosure 110 that are likely to come into contact with a user's hand.

According to some examples, the external surface of the support plate 520 may include multiple dots or specks as formed by a stippling process. Beneficially, the stippling process induces stress on the support plate 520 so as to minimize the material(s) of the support plate 520 from relaxing and causing deformation. Additionally, the stippling process is capable of controlling the flatness of the support plate 520.

FIG. 6 illustrates a cross-sectional view of a portable electronic device 600 as taken along the reference section B-B of the portable electronic device 400, in accordance with some embodiments. The portable electronic device 600 is similar to the portable electronic device 500 illustrated in FIG. 5 except that the enclosure 110 includes a rail element 612 that protrudes from an inner surface of the enclosure 110—e.g., the side wall 112-C. The rail element 612 may be integrally formed with the enclosure 110 in some examples. As illustrated in FIG. 6, the rail element 612 overlays and is joined to an external surface of the support plate 520, such as through a weld. In this manner, the rail element 612 increases an amount of surface area that can be used to join the enclosure 110 to the support plate 520, thereby increasing the stiffness of the support plate 520. In some examples, the enclosure 110 is formed of aluminum and the external surface of the support plate 520 includes a cladded stainless steel layer—e.g., the upper stiffening layer 522-A. By overlaying the rail element 612 over the external surface of the support plate 520, there is more surface area to weld between cladded stainless steel and the aluminum.

FIGS. 7A-7F illustrate cross-sectional views of various embodiments of a support plate 700 that is capable of supporting at least one operational component(s) within a cavity of a portable electronic device—e.g., the portable electronic device 100.

Figure 7A:
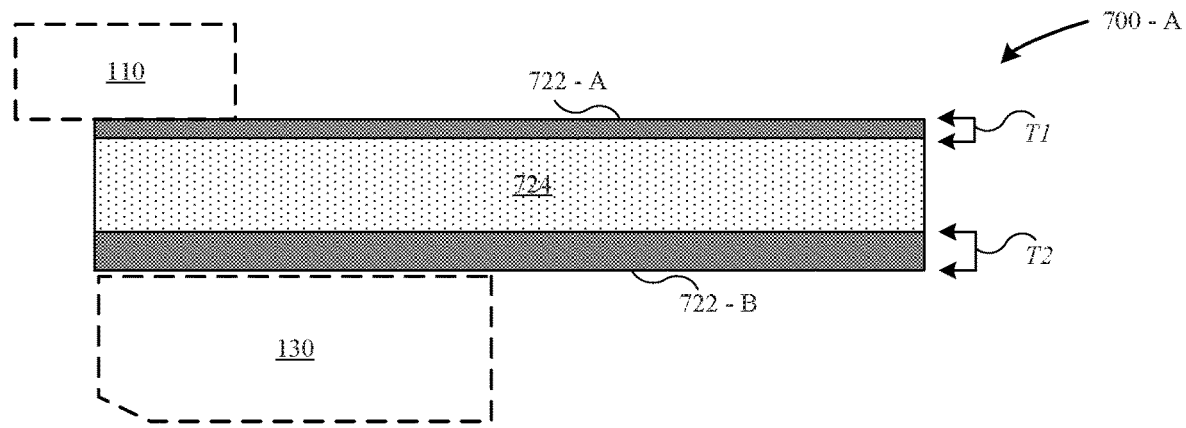
FIGS. 7A-7F illustrate cross-sectional views of a support structure for dissipating thermal energy generated by an operational component, in accordance with various embodiments.

FIG. 7A illustrates a support plate 700-A, in accordance with some embodiments, where the support plate 700-A includes a thermally conductive core 724 that is separated by an upper stiffening layer 722-A having a thickness (T1) and a lower stiffening layer 722-B having a thickness (T2). As illustrated in FIG. 7A, the upper and lower stiffening layers 722-A, B have different thicknesses, where T2>T1. For example, the upper and lower stiffening layers 722-A, B may have different stiffening materials; therefore, the support plate 700-A may be capable of sufficiently supporting the operational component(s).

Figure 7B:
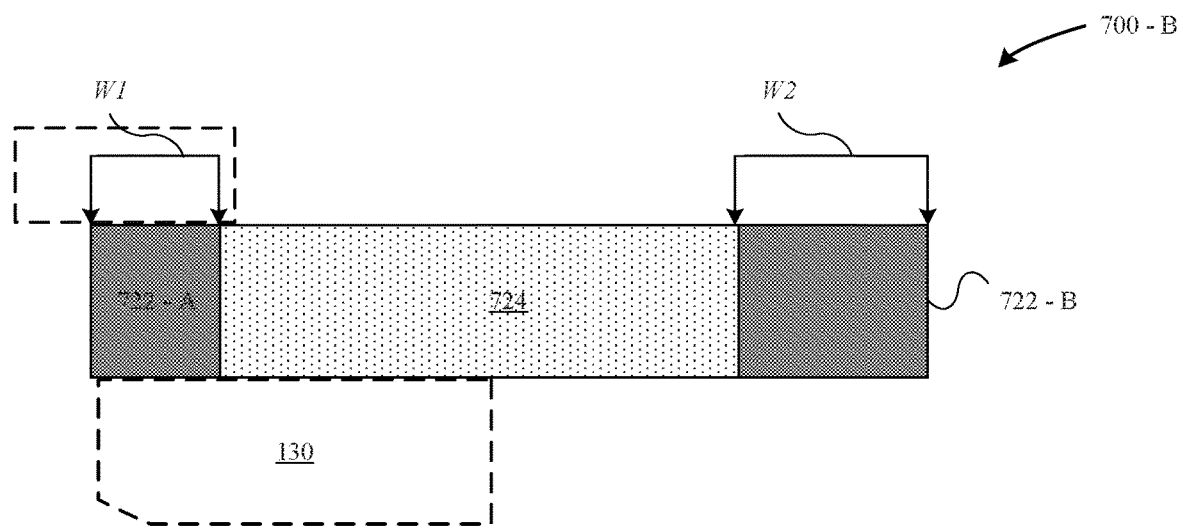

FIG. 7B illustrates a support plate 700-B, in accordance with some embodiments, where the support plate 700-B includes a thermally conductive core 724 that is separated by a left adjacent stiffening layer 722-A having a width (W1) and a right adjacent stiffening layer 722-B having a width (W2). It should be noted that the left and right adjacent stiffening layers 722-A, B may be formed of material that is capable of being welded to the enclosure—e.g., the enclosure 110—so as to securely fix the support plate 700-B. According to some examples, the widths W1, W2 of the left and right adjacent stiffening layers 722-A, B overlap with a sufficient amount of a surface area of the enclosure 110. In some examples, the widths W1, W2 are different, and in other examples, the widths W1, W2 are the same.

Figure 7C:
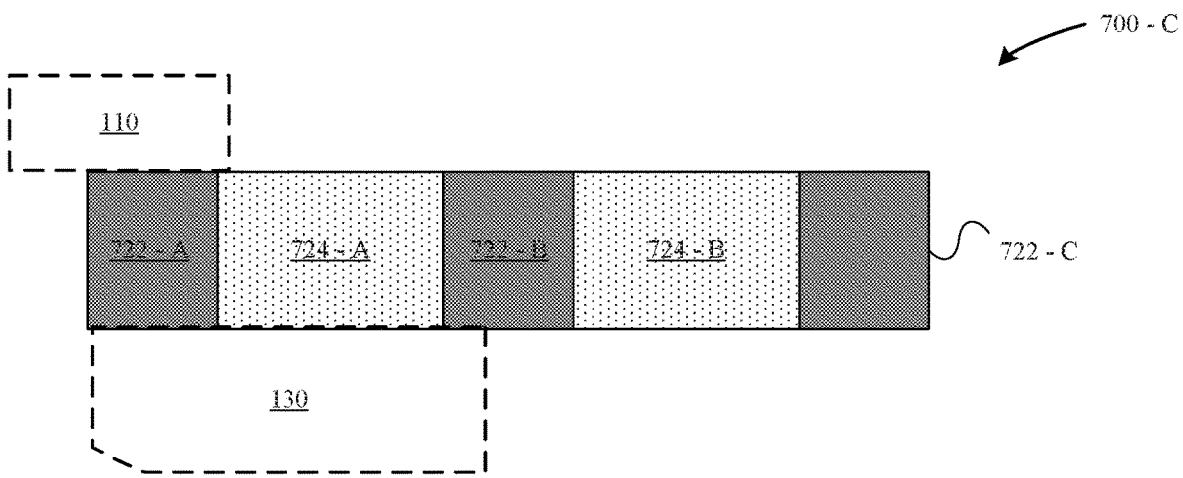

FIG. 7C illustrates a support plate 700-C, in accordance with some embodiments, where the support plate 700-C includes multiple thermally conductive cores 724-A, B that are separated by a left adjacent stiffening layer 722-A, an intermediate stiffening layer 722-B, and a right adjacent stiffening layer 722-B. It should be noted that the left, intermediate, and right stiffening layers 722-A, B, C are formed of material that is capable of being welded to the enclosure—e.g., the enclosure 110—so as to securely fix the support plate 700-C.

Figure 7D:
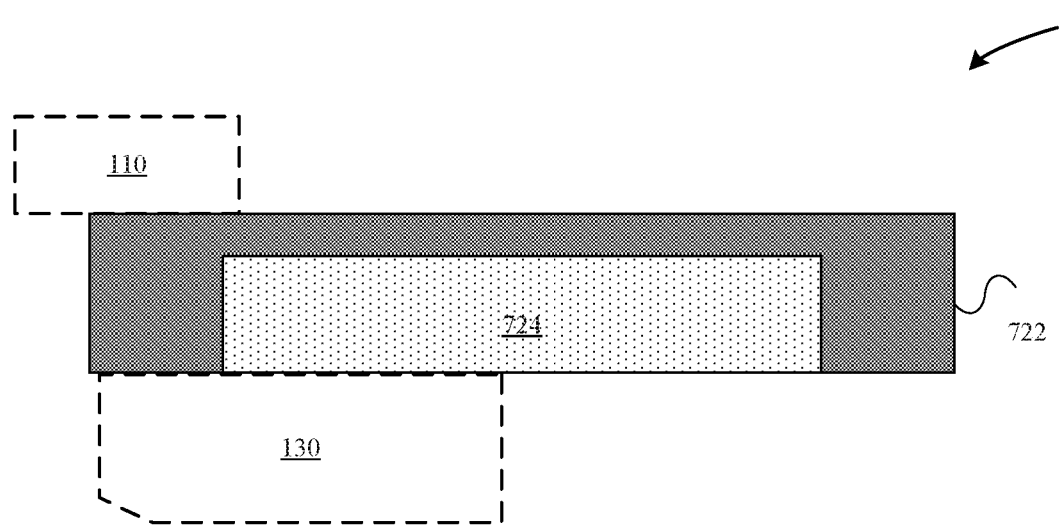

FIG. 7D illustrates a support plate 700-D, in accordance with some embodiments, where a thermally conductive core 724 is formed by removing material from a lower surface of a stiffening layer 722.

Figure 7E:
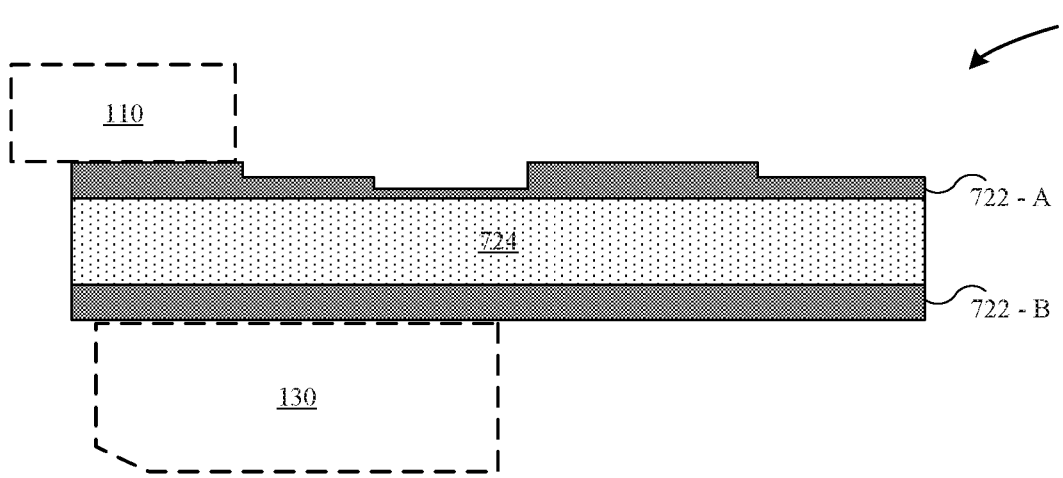

FIG. 7E illustrates a support plate 700-E, in accordance with some embodiments, where a thermally conductive core 724 is positioned between upper and lower stiffening layers 722-A, B. In contrast to the support plate 700-A, the upper stiffening layer 722-A of the support plate 700-E has a non-linear geometry that is capable of accommodating for operational component(s) having different geometries and/or support structures (e.g., enclosure 110, etc.) having different geometries. In some examples, the upper stiffening layer 722-A may have a generally curved shape, polygonal shape, and the like. Additionally, the lower stiffening layer 722-B may also have a generally curved shape, polygonal shape, and the like. Beneficially, by adopting an irregular and/or non-linear geometry, the support plate 700-E is capable of fitting within a cavity and accommodating for different geometries of adjacent support structures (e.g., trim structure, enclosure, etc.) while still being capable of conducting thermal energy and providing a sufficient amount of stiffness. In other words, the geometry of the support plate 700-E may be modified to adapt to the dimensions of support structures in the portable electronic device—e.g., the portable electronic device 100.

Figure 7F:
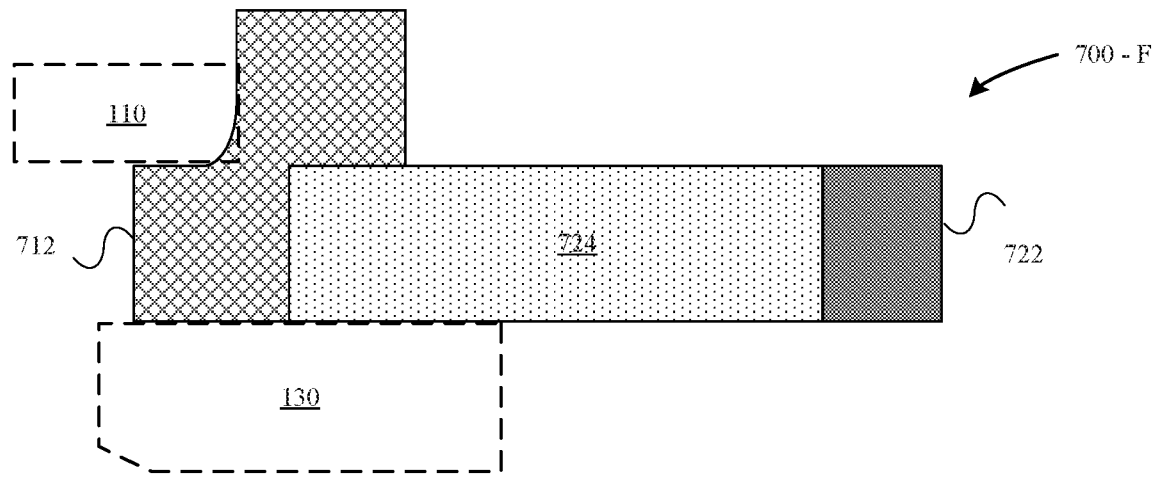

FIG. 7F illustrates a support plate 700-F, in accordance with some embodiments, where an end surface of a thermally conductive core 724 is cladded to a stiffening layer 722 along a heat affected zone. Instead of another stiffening layer that is cladded to another end surface of the thermally conductive core 724, a stiffening element 712 is welded to a lower surface of the enclosure—e.g., the enclosure 110—and an upper surface of the thermally conductive core 724. According to some examples, the stiffening element 712 and the support plate 700-F are supported by the back wall—e.g., the back wall 130. In some examples, the stiffening element 712 is a unibody construction.

With reference to the support plates 700-A, B, C, D, E, F, it should be noted that these support plates may include different sections having different combinations of layers, dimensions, and/or ratios of materials. For instance, if a greater amount of stiffness is required for the left adjacent stiffening layer 722-A to weld to the enclosure 110, then a greater amount of a stiffness-promoting material, such as stainless steel or titanium may be included in the left adjacent stiffening layer 722-A relative to the right adjacent stiffening layer 722-B. In another example, with reference to the support plate 700-C, the thermally conductive core 724-A may include a greater amount/concentration of a thermally conductive material (e.g., copper, etc.) than the thermally conductive core 724-B because the thermally conductive core 724-A supports an operational component (e.g., a battery) that generates a greater amount of heat than the operational component (e.g., a camera) that is supported by the thermally conductive core 724-B. In some embodiments, a single thermally conductive core—e.g., the thermally conductive core 724 and/or a single stiffening layer—e.g., the upper stiffening layer 722-A may include different regions having different thicknesses, ratio of materials, and the like in order to impart localized differences in thermal conductivity or stiffness.

Figure 8A:
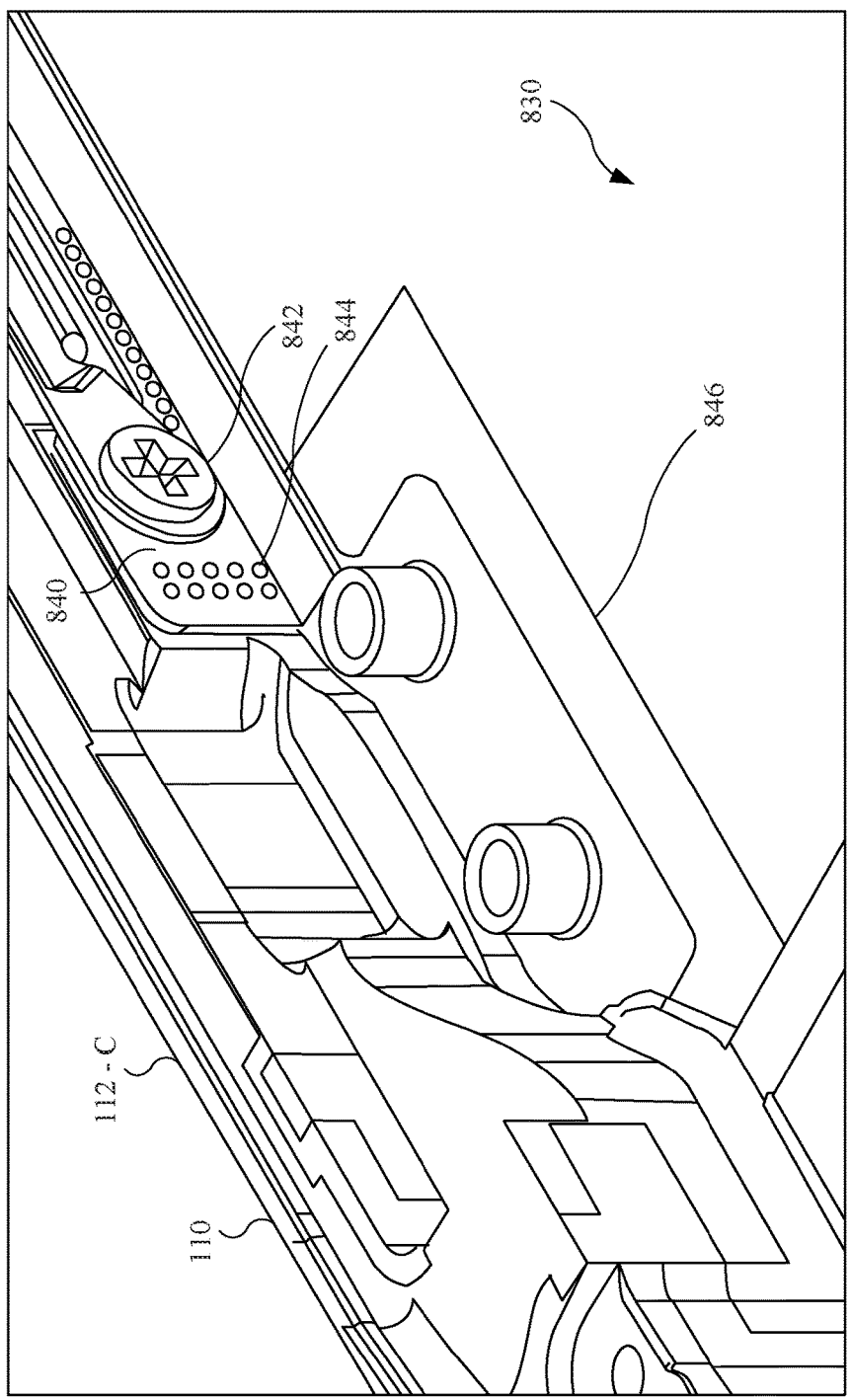
FIGS. 8A-8B illustrate various views of a portable electronic device that includes a support structure for dissipating thermal energy generated by an operational component, in accordance with some embodiments.
Figure 8B:
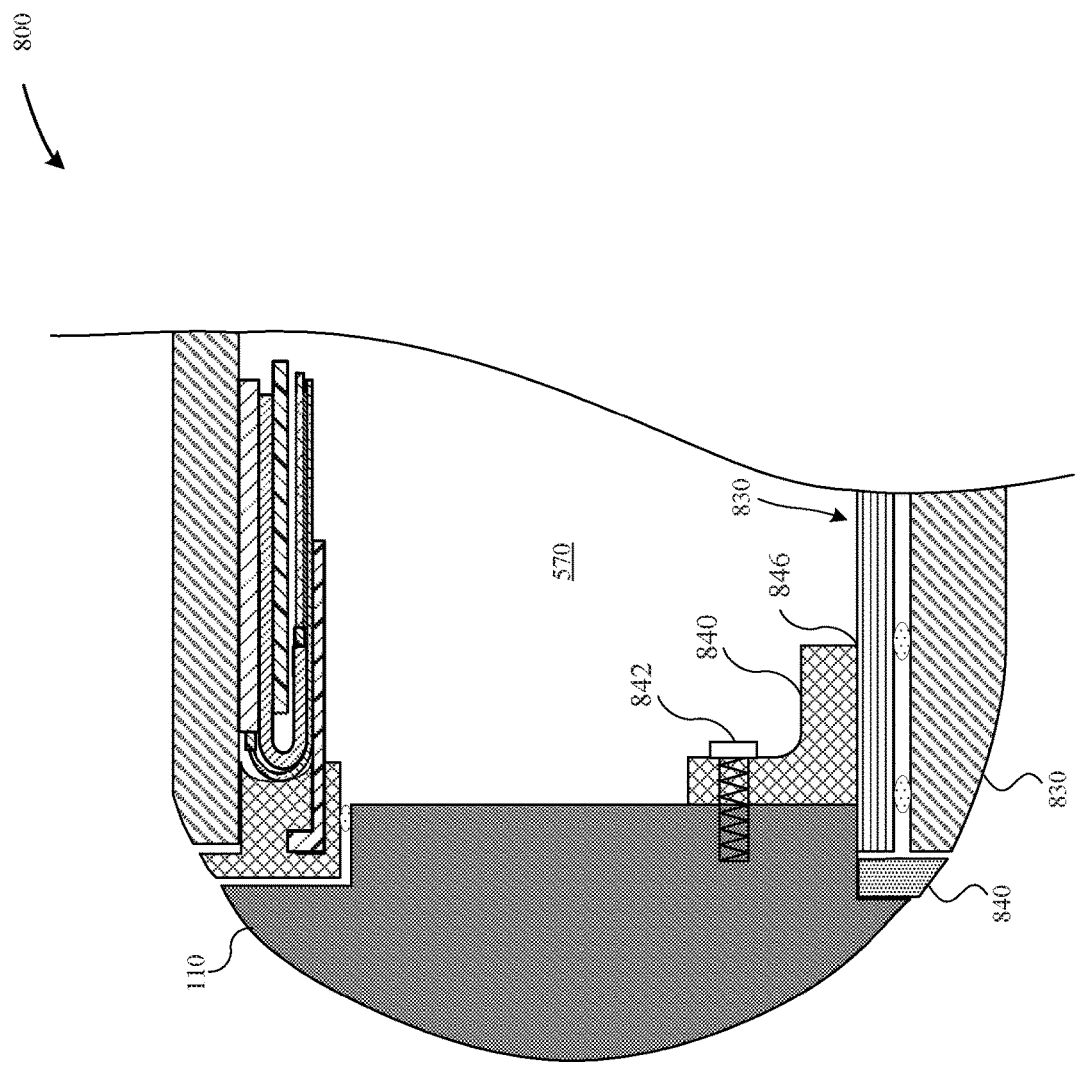

FIGS. 8A-8B illustrate different views of a portable electronic device 800 that includes a support plate 830 for supporting at least one operational component, in accordance with some embodiments. FIG. 8A illustrates a perspective view and FIG. 8B illustrates a cross-sectional view of the portable electronic device 800 that includes a support plate 830 that is welded to the side wall 112-C. The support plate 830 is welded to the side wall 112-C as indicated by a weld line 846. Additionally, the support plate 830 is further joined to the side wall 112-C using a rail feature 840 for added stiffness. The rail feature 840 includes a fastener 842 that extends through the side wall 112-C and attaches the rail feature 840 to the side wall 112-C. The rail feature 840 may also be secured to the side wall 112-C with weld spots 844.

Figure 9:
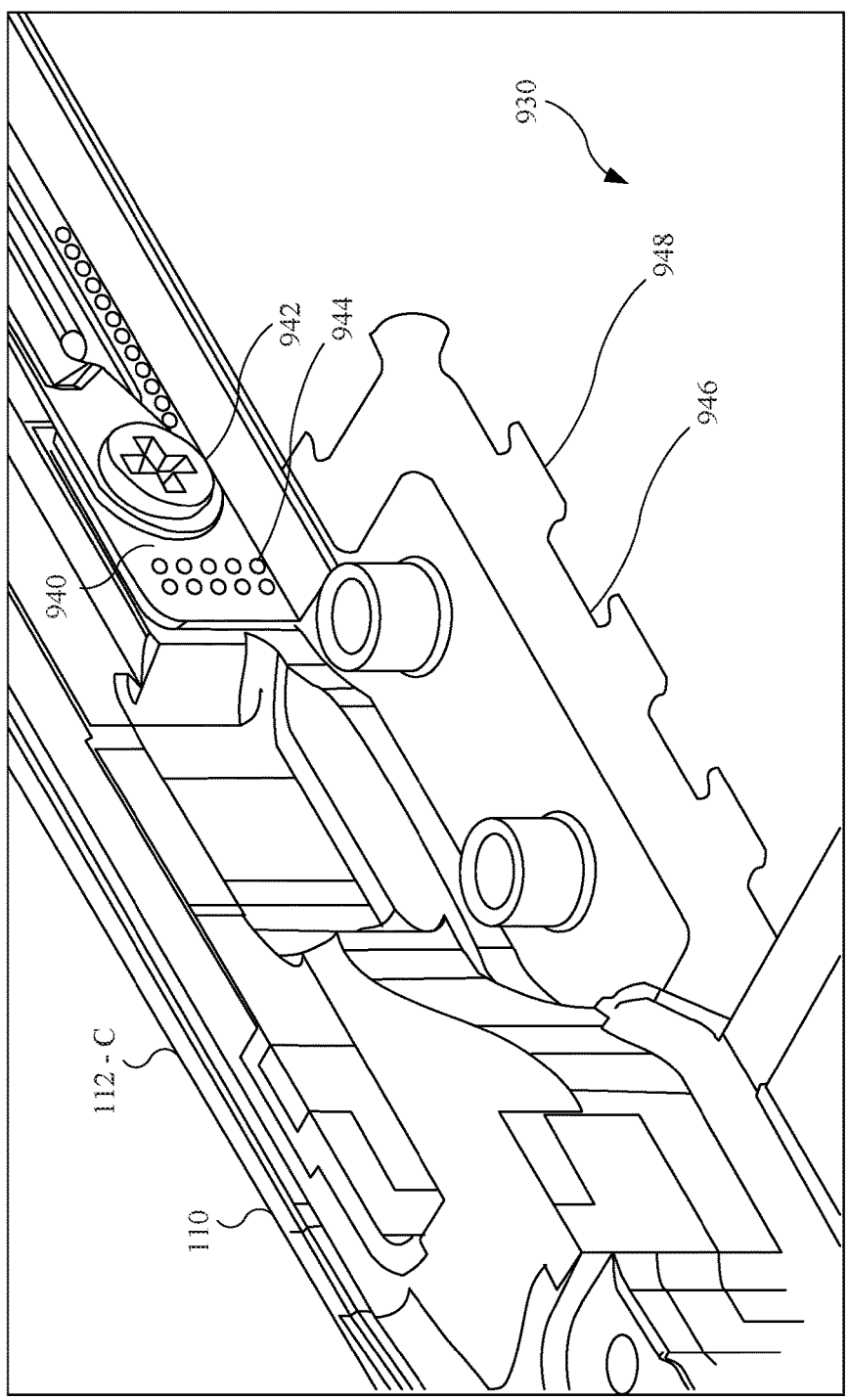
FIG. 9 illustrates a perspective view of a portable electronic device that includes a support structure for dissipating thermal energy generated by an operational component, in accordance with some embodiments.

FIG. 9 illustrates a perspective view of a portable electronic device 900 that includes a support plate 930 for supporting at least one operational component, in accordance with some embodiments. The portable electronic device 900 includes a support plate 930 that is welded to the side wall 112-C. The support plate 930 is welded to the side wall 112-C as indicated by a weld line 846. Additionally, the support plate 930 is further joined to the side wall 112-C using a rail feature 940 having a dovetail joint 948 that interlocks with the support plate 930. The support plate 930 is welded to the side wall 112-C as indicated by a weld line 946. Additionally, the rail feature 940 includes a fastener 942 that extends through the side wall 112-C and attaches the rail feature 940 to the side wall 112-C. The rail feature 940 may also be secured to the side wall 112-C with weld spots 944.

Figure 10:
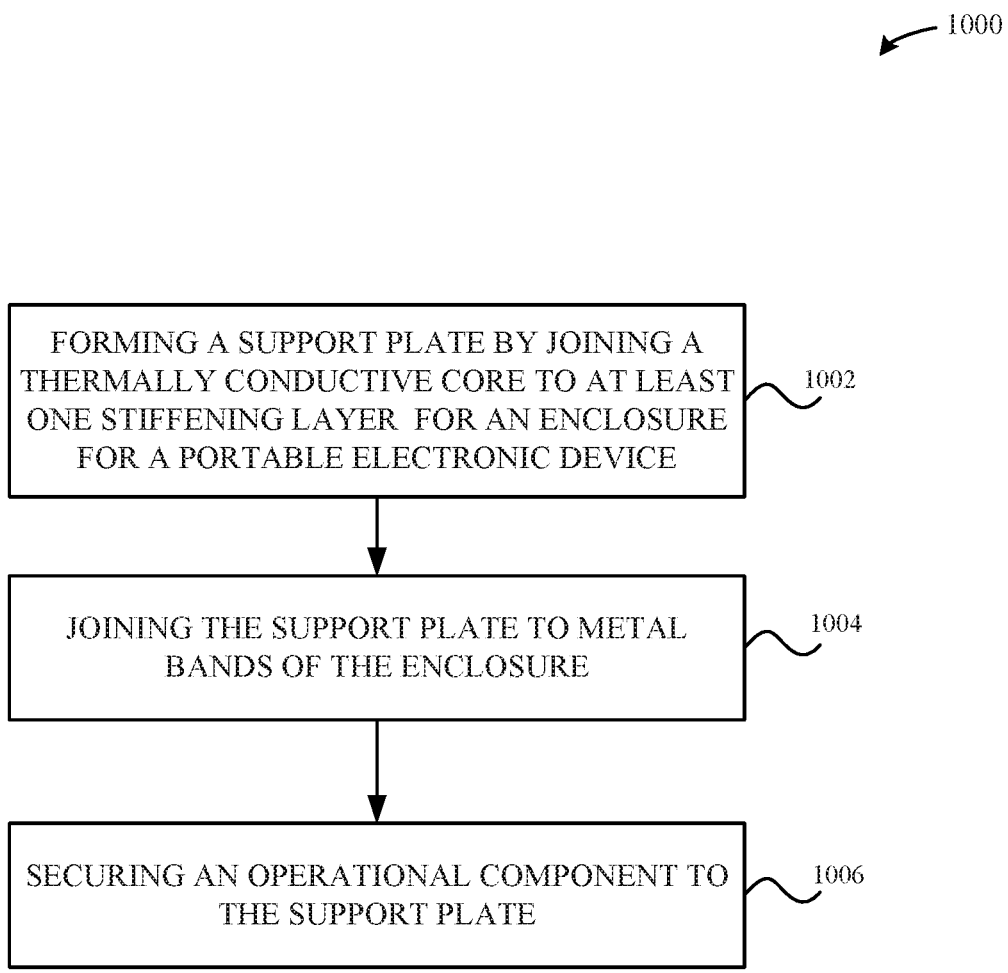
FIG. 10 illustrates a flowchart for forming a support structure for a portable electronic device, in accordance with some embodiments.

FIG. 10 illustrates a flow diagram of a method 1000 for forming an enclosure for a portable electronic device that includes a support plate, in accordance with some embodiments. As illustrated in FIG. 10, the method 1000 begins at step 1002 where a support plate—e.g., the support plate 520—is formed by joining a thermally conductive core—e.g., the thermally conductive core 524—to at least one stiffening layer—e.g., the upper stiffening layer 522-A. Although the method 1000 is described with reference to the portable electronic device 500 of FIG. 5, it should be noted that the method can equally apply to any one of the portable electronic devices 100, 200, 300, 400, 500, 600, 800 or 900 as described herein.

At step 1004, the support plate 520 is joined to metal bands—e.g., the side walls 112-C of the enclosure 110.

At step 1006, one or more operational components are secured to a surface of the support plate 520.

Figure 11:
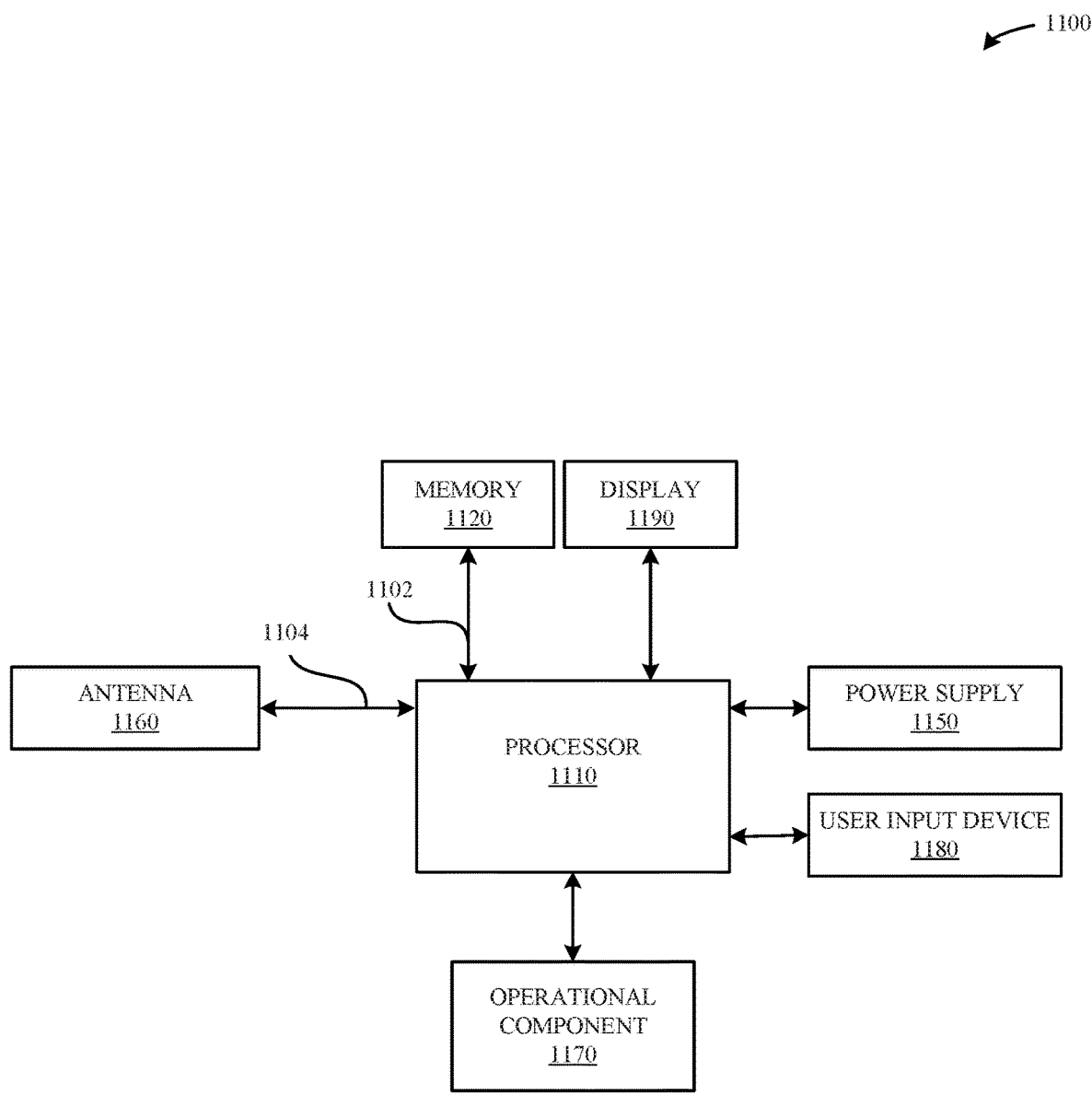
FIG. 11 illustrates a system diagram of a portable electronic device that is capable of implementing the various techniques as described herein, in accordance with some embodiments.

FIG. 11 illustrates a system diagram of a portable electronic device 1100 that is capable of implementing the various techniques described herein, according to some embodiments. In particular, the detailed view illustrates various components that can be included in the portable electronic device 100 as illustrated in FIG. 1.

As shown in FIG. 11, the portable electronic device 1100 can include a processor 1110 for controlling the overall operation of the portable electronic device 1100. The portable electronic device 1100 can include a display 1190. The display 1190 can be a touch screen panel that can include a sensor (e.g., capacitance sensor). The display 1190 can be controlled by the processor 1110 to display information to the user. A data bus 1102 can facilitate data transfer between at least one memory 1120 and the processor 1110. The portable electronic device 1100 can also include a network/bus interface 1104 that couples a wireless antenna 1160 to the processor 1110.

The portable electronic device 1100 can include a user input device 1180, such as a switch. The portable electronic device 1100 includes a power supply unit 1150, such as a lithium-ion battery. The portable electronic device 1100 also includes a memory 1120, which can comprise a single disk or multiple disks (e.g., hard drives), and includes a storage management module that manages one or more partitions within the memory 1120. In some embodiments, the memory 1120 can include flash memory, semiconductor (solid state) memory or the like. The portable electronic device 1100 can also include a Random Access Memory (RAM) and a Read-Only Memory (ROM). The ROM can store programs, utilities or processes to be executed in a non-volatile manner. The RAM can provide volatile data storage, and stores instructions related to the operation of the portable electronic device 1100.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A portable electronic device, comprising:
    an enclosure that defines a cavity, the enclosure comprising a metal wall;
    an operational component located in the cavity, the operational component capable of generating thermal energy;
    a support plate located in the cavity and joined to the metal wall, the support plate comprising:
        a thermally conductive core that is thermally coupled to the operational component, the thermally conductive core comprising a first surface and a second surface that is opposite the first surface,
        a first stiffening layer coupled with the thermally conductive core at the first surface, wherein the operational component is located on the first stiffening layer, and
        a second stiffening layer coupled with the thermally conductive core at the second surface, wherein the thermally conductive core includes a first thermal conductivity, and wherein each of the first stiffening layer and the second stiffening layer include a second thermal conductivity that is less than the first thermal conductivity; and
    a display assembly secured with the enclosure, wherein the operational component is positioned between the display assembly and the first stiffening layer.

2. The portable electronic device of claim 1, wherein the operational component comprises a camera system.

3. The portable electronic device of claim 1, wherein the thermally conductive core includes at least one of copper or aluminum, and wherein each of the first stiffening layer and the second stiffening layer includes at least one of stainless steel, molybdenum, or titanium.

4. The portable electronic device of claim 1, wherein the operational component comprises a power supply.

5. The portable electronic device of claim 1, further comprising a back wall coupled to the metal wall, wherein the back wall comprises a non-metal material.

6. The portable electronic device of claim 5, wherein the first stiffening layer includes a first thickness, and wherein the second stiffening layer is equivalent to the first thickness.

7. The portable electronic device of claim 1, wherein the thermally conductive core separates the first stiffening layer from the second stiffening layer such that the first stiffening layer is free of contact from the second stiffening layer.

8. A portable electronic device, comprising:
    an enclosure comprising a glass back wall and a metal band that combines with the glass back wall to that define a cavity;
    an operational component that generates thermal energy within the cavity;
    a support plate that (i) is thermally coupled to and joined to the metal band, and (ii) carries the operational component, wherein the support plate includes:
        a stiffening layer, wherein the operational component is located on the stiffening layer,
        a thermally conductive core that is overlaid by the stiffening layer, wherein the thermally conductive core defines a directional path by which the thermal energy received by the thermally conductive core is conducted away from the operational component, and
        a thermal insulation layer that is overlaid by the thermally conductive core, wherein the thermal insulation layer prevents the thermal energy received by the thermally conductive from passing through the glass back wall.

9. The portable electronic device of claim 8, wherein the thermal insulation layer is positioned between the thermally conductive core and the glass back wall.

10. The portable electronic device of claim 8, wherein the thermal insulation layer comprises a first thickness, and wherein the thermally conductive core comprises a second thickness that is greater than the first thickness.

11. The portable electronic device of claim 8, wherein the metal band comprises stainless steel.

12. The portable electronic device of claim 8, wherein the operational component comprises a camera system or a power supply.

13. The portable electronic device of claim 8, wherein the support plate has a thickness, and the thermal insulation layer has a thickness that accounts for no more than about 50% of the thickness of the support plate.

14. The portable electronic device of claim 8, wherein the thermally conductive core includes at least one of aluminum, copper, or molybdenum.

15. A portable electronic device, comprising:
    an operational component that generates heat;
    walls that define a cavity, wherein the operational component is carried within the cavity;
    a support plate that carries and is overlaid by the operational component, the support plate being thermally coupled to and joined to the walls, the support plate including:
        a thermally conductive core capable of conducting the heat away from the operational component and towards the walls,
        a first metal layer secured with the thermally conductive core, and
        a second metal layer secured with the thermally conductive core, wherein the first metal layer is free of contact with the second metal layer based on the thermally conductive core; and
    a display assembly secured with the walls, wherein the operational component is positioned between the display assembly and the first metal layer.

16. The portable electronic device of claim 15, wherein the first metal layer and the second metal layer include cladded stainless steel.

17. The portable electronic device of claim 15, wherein the first metal layer and the second metal layer are welded to opposing surfaces of the thermally conductive core.

18. The portable electronic device of claim 15, wherein a shape of the thermally conductive core is substantially maintained while the thermally conductive core conducts the heat away from the operational component.

19. The portable electronic device of claim 15, wherein the operational component comprises a power supply.

20. The portable electronic device of claim 15, wherein the operational component comprises a circuit.

\* \* \* \* \*